(12) United States Patent
Choi et al.

(10) Patent No.: US 10,908,827 B2
(45) Date of Patent: Feb. 2, 2021

(54) SEMICONDUCTOR MEMORY DEVICES, AND MEMORY SYSTEMS AND ELECTRONIC APPARATUSES HAVING THE SAME

(71) Applicant: Samsung Electronics Co., Ltd., Suwon-si (KR)

(72) Inventors: Yeon Kyu Choi, Hwaseong-si (KR); Ki Seok Oh, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 69 days.

(21) Appl. No.: 16/007,363

(22) Filed: Jun. 13, 2018

(65) Prior Publication Data

US 2019/0205051 A1   Jul. 4, 2019

(30) Foreign Application Priority Data

Jan. 2, 2018 (KR) .................. 10-2018-0000205

(51) Int. Cl.
*G06F 3/06* (2006.01)
*G06F 12/02* (2006.01)
(Continued)

(52) U.S. Cl.
CPC .......... *G06F 3/0625* (2013.01); *G06F 3/0659* (2013.01); *G06F 3/0673* (2013.01);
(Continued)

(58) Field of Classification Search
CPC .... G06F 3/0625; G06F 3/0659; G06F 3/0673; G11C 7/109; G11C 8/08; G11C 8/18; G11C 7/1063; G11C 8/06; G11C 7/1096; G11C 7/1015; G11C 7/1018; G11C 11/4093; A61F 7/007; A61F 7/08; A61F 7/02; A61F 2007/0204; A61F 2007/0048; A61F 2007/0071

See application file for complete search history.

(56) References Cited

U.S. PATENT DOCUMENTS 5,966,343 A * 10/1999 Thurston .............. G11C 7/1018
  365/233.1
6,549,997 B2   4/2003 Kalyanasundharam
(Continued)

*Primary Examiner* — Charles Rones
*Assistant Examiner* — Tong B. Vo
(74) *Attorney, Agent, or Firm* — Harness, Dickey & Pierce, P.L.C.

(57) ABSTRACT

A semiconductor memory device is configured to input a mode set code and set data on-the-fly in response to a mode set command, process data bit number information a write command to generate a first data signal, process data bit number information with a read command to generate a second data signal in response to the data on-the-fly indicating an enabled state, access a selected memory cell based on a word line selection signal generated using a row address and active command and a column selection signal generated using a column address and write command or read command, process a first quantity of data bits and transmit the first quantity of data bits to the selected memory cell in response to the first data signal, and process data received from the selected memory cell and output a second quantity of data bits in response to the second data signal.

20 Claims, 9 Drawing Sheets

(51) Int. Cl.

| | | |
|---|---|---|
| *G06F 12/0831* | (2016.01) | |
| *G06F 12/128* | (2016.01) | |
| *G06F 12/0808* | (2016.01) | |
| *G06F 12/0895* | (2016.01) | |
| *G06F 12/0897* | (2016.01) | |
| *G06F 12/0891* | (2016.01) | |
| *G06F 12/0864* | (2016.01) | |
| *G11C 7/10* | (2006.01) | |
| *G11C 8/06* | (2006.01) | |
| *G11C 8/18* | (2006.01) | |
| *G11C 8/08* | (2006.01) | |

(52) U.S. Cl.
CPC ............ *G11C 7/109* (2013.01); *G11C 7/1015* (2013.01); *G11C 7/1018* (2013.01); *G11C 7/1063* (2013.01); *G11C 7/1096* (2013.01); *G11C 8/06* (2013.01); *G11C 8/08* (2013.01); *G11C 8/18* (2013.01)

(56) References Cited

U.S. PATENT DOCUMENTS

| | | | |
|---|---|---|---|
| 6,751,159 | B2 | 6/2004 | Farrell et al. |
| 7,657,724 | B1 | 2/2010 | DeHaemer |
| 7,761,683 | B2 | 7/2010 | Ripley |
| 8,200,879 | B1* | 6/2012 | Falik ........................ G11C 5/02 |
| | | | 710/307 |
| 8,411,528 | B2 | 4/2013 | Lee et al. |
| 8,804,455 | B2 | 8/2014 | Lee et al. |
| 9,256,532 | B2 | 2/2016 | Li et al. |
| 9,257,151 | B2 | 2/2016 | Perego et al. |
| 9,588,902 | B2 | 3/2017 | Terry et al. |
| 2003/0081492 | A1* | 5/2003 | Farrell ................ G11C 11/4087 |
| | | | 365/238.5 |
| 2003/0158995 | A1 | 8/2003 | Lee et al. |
| 2003/0214845 | A1* | 11/2003 | Yamazaki ............... G11C 29/34 |
| | | | 365/189.04 |
| 2015/0089164 | A1* | 3/2015 | Ware ........................ G11C 7/10 |
| | | | 711/149 |
| 2015/0254181 | A1* | 9/2015 | Andre ................ G11C 11/1693 |
| | | | 711/143 |
| 2017/0017434 | A1 | 1/2017 | Bang et al. |
| 2017/0031839 | A1 | 2/2017 | Murray et al. |
| 2017/0068455 | A1 | 3/2017 | Xing et al. |

\* cited by examiner

FIG. 3

| COM | CS | CA | | | | | CAn | CK |
|---|---|---|---|---|---|---|---|---|
| | | CA1 | CA2 | CA3 | CA4 | CA5 | | |
| MODE REGISTER WRITE | H | L | H | H | L | L | | |
| | L | H | L | PS OTF | BL OTF | DQ OTF | PS1 | |
| ACTIVATE | H | L | L | H | PS1 | L | | |
| | L | H | L | L | L | L | = | |
| WRITE | H | L | L | H | DQ1 | L | BL1 | |
| | L | L | H | L | L | L | = | |
| READ | H | L | L | L | DQ1 | L | BL1 | |
| | L | L | H | L | L | L | = | |

SEMICONDUCTOR MEMORY DEVICES, AND MEMORY SYSTEMS AND ELECTRONIC APPARATUSES HAVING THE SAME

CROSS-REFERENCE TO RELATED APPLICATION

This application claims priority under 35 U.S.C. § 119 to Korean Patent Application No. 10-2018-0000205, filed on Jan. 2, 2018, with the Korean Intellectual Property Office (KIPO), the disclosure of which is incorporated herein by reference in its entirety.

BACKGROUND

1. Field

Example embodiments of the inventive concepts relate to semiconductor memory devices, and memory systems and electronic devices having the same.

2. Discussion of Related Art

Memory systems may include a semiconductor memory device configured to input or output data, and a memory controller configured to control the semiconductor memory device. Electronic devices may include a semiconductor memory device configured to input or output data (e.g., a dynamic random access memory (DRAM) device), and a system on chip (SoC) including a memory controller configured to control the semiconductor memory device.

In semiconductor memory devices, the number ("quantity") of bits of data may be fixed during a write operation and a read operation, and thus the fixed number of bits of data may be input or output. During operations of memory systems and electronic devices, the write operation and the read operation of a semiconductor memory device may be more frequently performed, and thus power consumption may increase during the write operation and the read operation.

SUMMARY

Some example embodiments provide a technique for reducing power consumption during a write operation and a read operation to decrease total power consumption of a memory system and an electronic device.

Some example embodiments of the inventive concepts provide a semiconductor memory device configured to reduce power consumption, and a memory system and an electronic device each including the same.

Some example embodiments of the inventive concepts are not limited thereto. Additional example embodiments will be set forth in part in the description which follows and, in part, will be apparent from the description, or may be learned by practice of the presented example embodiments.

According to some example embodiments of the inventive concepts, a semiconductor memory device may include a control device configured to process a mode set code to set data on-the-fly in response to a mode set command, and process data bit number information in combination with a write command to generate a first data signal and process the data bit number information in combination with a read command to generate a second data signal, in response to the data on-the-fly indicating an enabled state; a memory cell array configured to input data to or output data from memory cells selected by a word line selection signal generated based on a row address and an active command and a column selection signal generated based on a column address and the write command or the read command; a data writer configured to process a first quantity of bits of data received from an external source and transmit the first quantity of bits of data to the selected memory cells, in response to the first data signal; and a data reader configured to process data received from the selected memory cells and transmit a second quantity of bits of data, in response to the second data signal.

According to some example embodiments of the inventive concepts, a memory system may include a memory controller configured to apply a chip selection signal and a command and address, and input or output data, in response to a clock signal, and a semiconductor memory device configured to input the chip selection signal and the command and address, and input or output the data, in response to the clock signal. The semiconductor memory device may be further configured to input an address included in the command and address as a mode set code, generate a data on-the-fly in response to the chip selection signal and a command included in the command and address applied in response to the clock signal indicate a mode set command, input a first quantity of bits of data input from an external source in response to data bit number information included in the address in response to the data on-the-fly indicating an enabled state and further in response to the command being a write command, and output a second quantity of bits of data to the external source in response to the data bit number information included in the address in response to the data on-the-fly indicating the enabled state and further in response to the command being a read command.

According to some example embodiments of the inventive concepts, an electronic device may include a system on chip configured to apply a chip selection signal and a command and address, and input or output data, in response to a clock signal, and a semiconductor memory device configured to process the chip selection signal and the command and address applied, and input or output the data, in response to the clock signal. The system on chip may include a first function device configured to input or output the data using a first bandwidth, a second function device configured to input or output the data using a second bandwidth which is greater than the first bandwidth, a memory controller configured to control data to be input or output between the first function device and the semiconductor memory device and control data to be input or output between the second function device and the semiconductor memory device, and a central processing unit configured to control the first function device, the second function device, and the memory controller. The semiconductor memory device may be further configured to process an address included in the command and address as a mode set code and generate a data on-the-fly in response to the chip selection signal and a command included in the command and address applied in response to the clock signal indicating a mode set command, input a first quantity of bits of data from an external source in response to data bit number information included in the address and further in response to the command being a write command, and output a second quantity of bits of data to the external source in response to the data bit number information included in the address and further in response to the command being a read command.

BRIEF DESCRIPTION OF THE DRAWINGS

FIG. 3 is a command truth table according to some example embodiments of the inventive concepts;

DETAILED DESCRIPTION

Hereinafter, semiconductor memory devices, and memory systems and electronic devices including the same according to some embodiments of the inventive concepts will be described with reference to the accompanying drawings.

Figure 1:
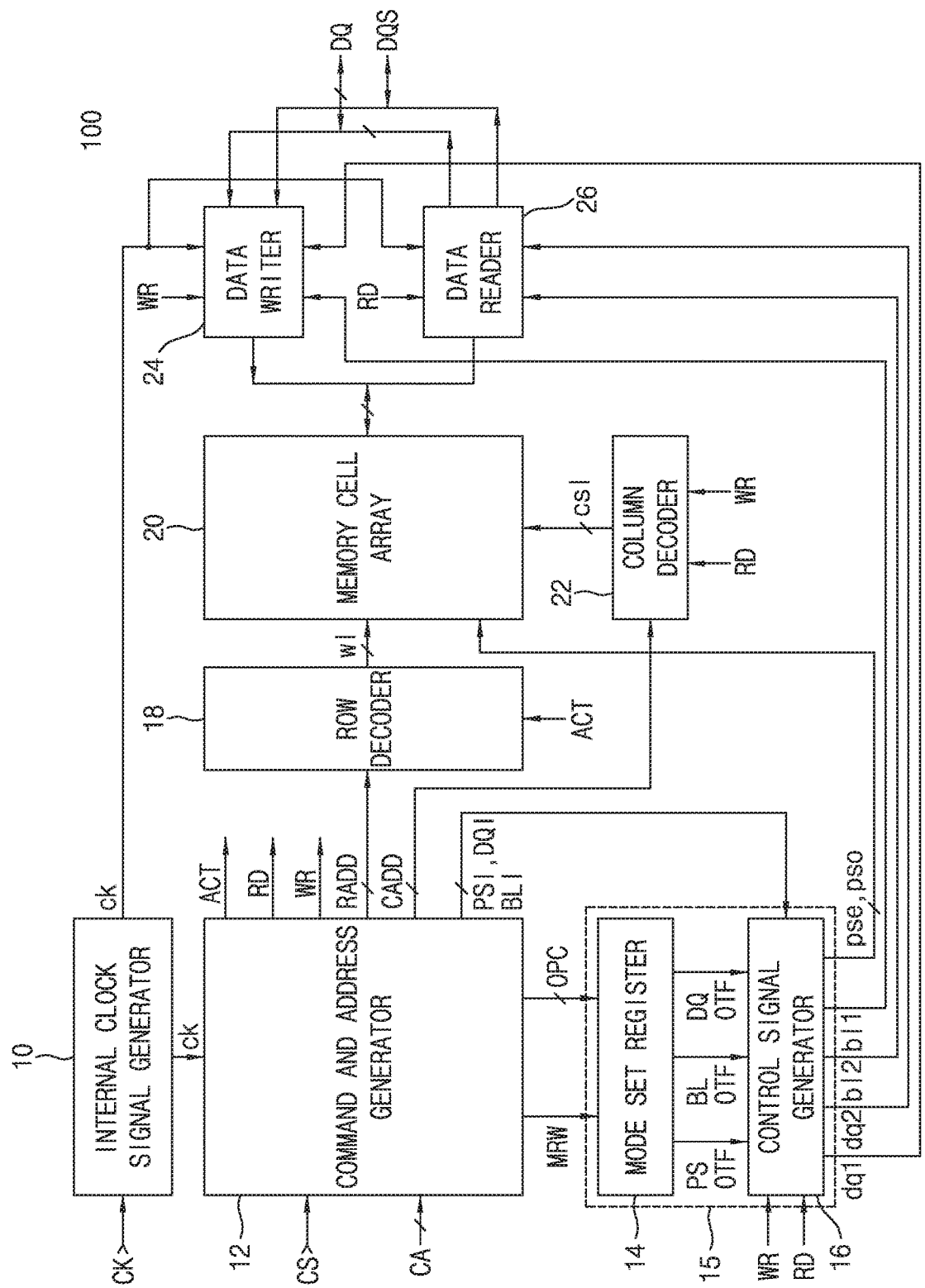
FIG. 1 is a block diagram illustrating a configuration of a semiconductor memory device according to some example embodiments of the inventive concepts.

FIG. 1 is a block diagram of a semiconductor memory device according to some example embodiments of the inventive concepts. A semiconductor memory device 100 may include an internal clock signal generator 10, a command and address generator 12, a mode set register 14, a control signal generator 16, a row decoder 18, a memory cell array 20, a column decoder 22, a data writer 24, and a data reader 26. As shown in FIG. 1, the semiconductor memory device 100 may include a control unit 15, also referred to herein as a "control device," that includes the mode set register 14 and the control signal generator 16.

It will be understood that a "memory cell array" refers to an array of memory cells, where each memory cell is an electronic circuit that is configured to store one bit of information.

Functions of the blocks illustrated in FIG. 1 will be described below.

The internal clock signal generator 10 may input ("process") a clock signal CK input ("received") from the outside (e.g., received from an external source and/or remote source in relation to the semiconductor memory device 100) to generate an internal clock signal ck.

The command and address generator 12 may generate commands including a mode set command MRW, an active command ACT, a write command WR, and a read command RD, and addresses including a row address RADD and a column address CADD or a code including mode set code OPC by ("based on") decoding a command and address CA input thereto, in response to the internal clock signal ck and a chip selection signal CS.

The mode set register 14, also referred to herein as a "mode register" as the term is commonly understood with regard to semiconductor memory devices, may input ("process") the mode set code OPC to set a page size on-the-fly PS OTF, a burst length on-the-fly BL OTP, or a data on-the-fly DQ OTP in response to the mode set command MRW. When the page size on-the-fly PS OTF is set to an enabled state, it may be understood that a page size is not fixed and is determined according to page size information input ("processed") together with the active command ACT. That is, the page size on-the-fly PS OTF may be information associated with a page size for determining whether to fix the page size or not. When the burst length on-the-fly BL OTF is set to an enabled state, it may be understood that a burst length is not fixed and is determined according to burst length information processed together with the write command WR or the read command RD. That is, the burst length on-the-fly BL OTF may be information associated with a burst length for determining whether to fix the burst length or not. Similarly, when the data on-the-fly DQ OTF is set to an enabled state, it may be understood that the number ("quantity") of bits of data is not fixed and is determined according to data bit number information processed together with the write command WR or the read command RD. That is, the data on-the-fly DQ OTF may be information associated with the number ("quantity") of bits of data for determining whether to fix the number ("quantity") of bits of data or not.

The control signal generator 16 may input ("process") page size information PSI and generate both an even-numbered page selection signal pse and an odd-numbered page selection signal pso in response to the page size on-the-fly PS OTF being set to ("indicating") the enabled state, and may process data bit number information DQI to generate a first data signal dq1 in response to the write command WR, and may process the data bit number information DQI to generate a second data signal dq2 in response to the read command RD, in response to the data on-the-fly DQ OTF being set to the enabled state. In response to the burst length on-the-fly BL OTF being set to the enabled state, the control signal generator 16 may process burst length information BLI to generate a first burst length signal bl1 in response to the write command WR, and process the burst length information BLI to generate a second burst length signal bl2 in response to the read command RD.

The row decoder 18 may generate word line selection signals wl based on decoding the row address RADD, in response to the active command ACT.

In response to both the even-numbered page selection signal pse and the odd-numbered page selection signal pso being activated, the memory cell array 20 may access (communicate data with) selected memory cells (not shown) connected to a word line of an even-numbered page memory cell array (not shown) and a word line of an odd-numbered page memory cell array (not shown) which are selected in response to the word line selection signals wl. In response to the even-numbered page selection signal pse being activated, the memory cell array 20 may access the particular memory cells connected to the selected word line of the even-numbered page of the memory cell array in response to the word line selection signals wl. In response to the odd-numbered page selection signal pso being activated, the memory cell array 20 may access the particular memory cells connected to the selected word line of the odd-numbered page memory cell array in response to the word line selection signals wl. The memory cell array 20 may input data to or output data from (e.g., may communicate with, may access, etc.) one or more memory cells selected ("one or more selected memory cells") in response to column selection signals csl among the particular memory cells connected to the selected word line.

The column decoder 22 may generate the column selection signals csl based on decoding the column address CADD in response to either the read command RD or the write command WR.

Restating the above, the memory cell array 20 may access a selected memory cell ("particular memory cell) based on 1) a word line selection signal wl generated based on a row address RADD and an active command ACT and 2) a column selection signal csl generated based on a column address CADD and 2a) the write command WR or 2b) the read command RD.

The data writer 24 may process data DQ input from the outside (e.g., a first quantity of bits of data DQ received from an external source and/or remote source in relation to the semiconductor memory device 100) to be aligned with a center of an input data strobe signal DQS in response to the write command WR, a first burst length signal bl1, and the first data signal dq1, and transmit the first quantity of bits of data DQ to the selected one or more memory cells of the memory cell array 20 in response to an internal clock signal ck. For example, the data writer 24 may process 1-bit data DQ having a burst length of k input from the outside in response to both the first burst length signal bl1 and the first data signal dq1 being activated, and may process ½-bit data DQ having the burst length of k/2 input from the outside in response to both the first burst length signal bl1 and the first data signal dq1 being deactivated. The data writer 24 may process the ½-bit data DQ having the burst length of k input from the outside in response to both the first burst length signal bl1 being activated and the first data signal dq1 being deactivated, and may process the 1-bit data DQ having the burst length of k/2 input from the outside in response to both the first burst length signal bl1 being deactivated and the first data signal dq1 being activated.

The data reader 26 may output ("transmit") data output from selected memory cells of the memory cell array 20 to the outside, as a second quantity of bits of data, to be aligned with an edge of the data strobe signal DQS, in response to the read command RD, the second burst length signal bl2, and the second data signal dq2. The data reader 26 may output the 1-bit or ½-bit data DQ having a burst length of k or k/2 to the outside according to the second burst length signal bl2 and the second data signal dq2.

The mode set register 14 and the control signal generator 16 may comprise a control unit 15. It will be understood, as described above, that the control unit 15, also referred to herein as a "control device" and/or "control logic," may refer to an instance of circuitry, of the semiconductor memory device 100, that collectively includes instances of circuitry of the mode set register 14 and the control signal generator 16 and/or is configured to implement the mode set register 14 and the control signal generator 16.

Figure 2:
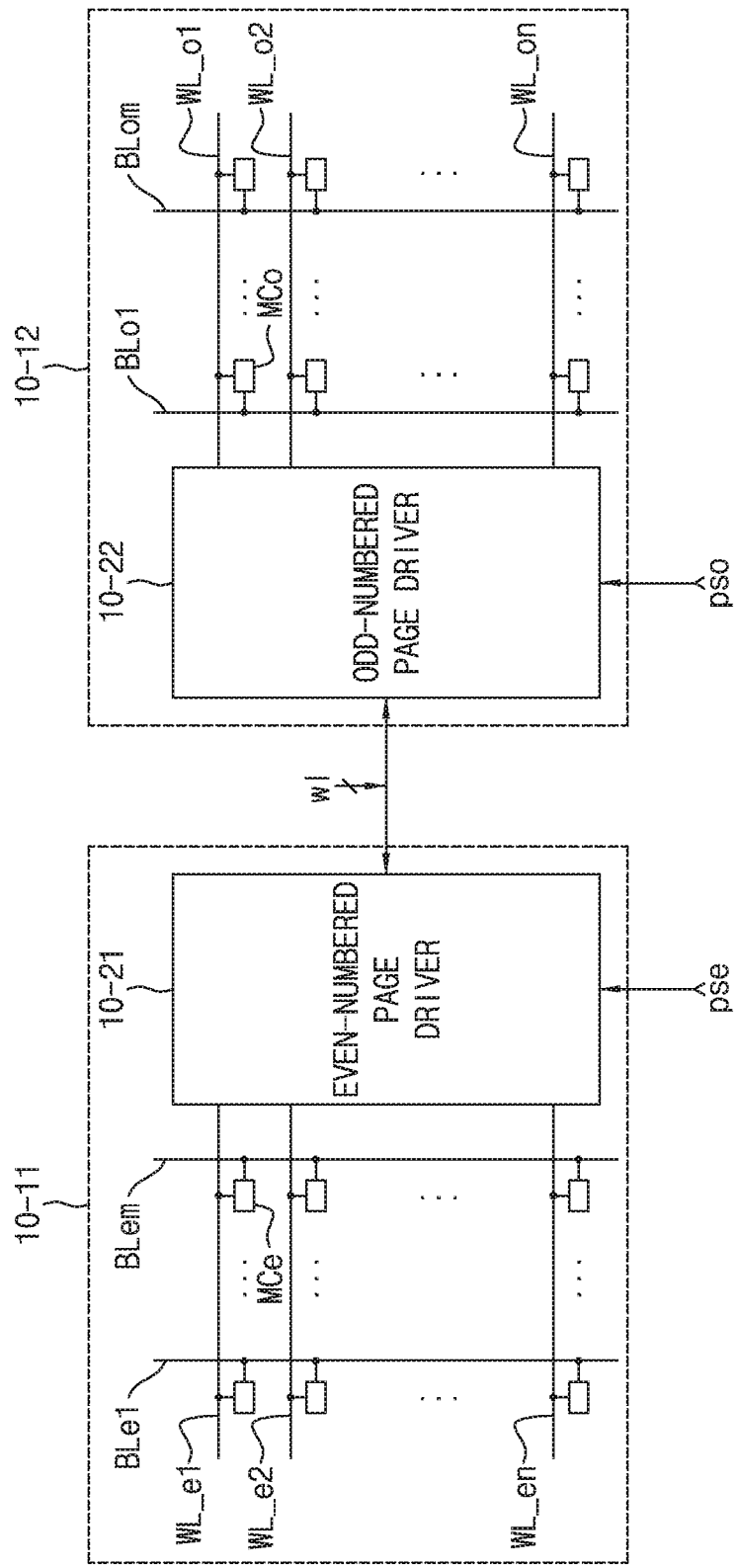
FIG. 2 is a block diagram illustrating a configuration of a memory cell array according to some example embodiments of the inventive concepts.

FIG. 2 is a schematic diagram illustrating the memory cell array 20 according to some example embodiments of the inventive concepts.

Referring to FIG. 2, the memory cell array 20 may include an even-numbered page memory cell array 10-11 and an odd-numbered page memory cell array 10-12. The even-numbered page memory cell array 10-11 may include a plurality of even-numbered memory cells MCe arranged between even-numbered word lines WL_e1 to WL_en and even-numbered bit lines BLe1 to BLem, and an even-numbered page driver 10-21. The odd-numbered page memory cell array 10-12 may include a plurality of odd-numbered memory cells MCo arranged between odd-numbered word lines WL_o1 to WL_on and odd-numbered bit lines BLo1 to BLom, and an odd-numbered page driver 20-22. Functions of the blocks of FIG. 2 will be described below.

The even-numbered page driver 10-21 may be enabled in response to the even-numbered page selection signal pse, and may select one of the even-numbered word lines WL_e1 to WL_en in response to the word line selection signals wl. The even-numbered memory cells MCe connected to one of the even-numbered word lines WL_e1 to WL_en may be simultaneously accessed. The odd-numbered page driver 10-22 may be enabled in response to the odd-numbered page selection signal pso, and may select one of the odd-numbered word lines WL_o1 to WL_on corresponding to the word line selection signals wl. The odd-numbered memory cells MCo connected to one of the odd-numbered word lines WL_o1 to WL_on may be simultaneously accessed.

In response to the even-numbered page selection signal pse being activated and the odd-numbered page selection signal pso being deactivated, an operation of the even-numbered page driver 10-21 may be enabled and thus one even-numbered word line may be selected in response to the word line selection signals wl. In response to the odd-numbered page selection signal pso being activated and the even-numbered page selection signal pse being deactivated, an operation of the odd-numbered page driver 10-22 may be enabled and thus one odd-numbered word line may be selected in response to the word line selection signals wl. In response to both the even-numbered page selection signal pse and the odd-numbered page selection signal pso being activated, both the operation of the even-numbered page driver 10-21 and the operation of the odd-numbered page driver 10-22 may be enabled and thus one even-numbered word line and one odd-numbered word line may be selected in response to the word line selection signals wl.

In response to both the even-numbered page selection signal pse and the odd-numbered page selection signal pso being activated, a page size may be 2 k and thus all of memory cells connected to one even-numbered word line and one odd-numbered word line of the memory cell array 20 may be accessed. That is, memory cells of full-page size may be accessed. In response to one of the even-numbered page selection signal pse and the odd-numbered page selection signal pso being activated, a page size may be 1 k and thus memory cells connected to one even-numbered word line or one odd-numbered word line of the memory cell array 20 may be accessed. That is, memory cells of a half-page size may be accessed. The number ("quantity") of activated memory cells when the memory cells of the half-page size are accessed is less than that when the memory cells of the full-page size are accessed and thus power consumption of the semiconductor memory device 100 may be decreased, thereby improving performance (at least by virtue of reducing electrical power consumption) of the semiconductor memory device and/or an electronic device (e.g., a computer system) and/or memory system including same. Thus, issues of sub-optimal performance (e.g., sub-optimal and/or excessive electrical power consumption) of the semiconductor memory device and/or an electronic device (e.g., a computer system) and/or memory system including same may be at least partially mitigated.

In FIG. 2, each of the even-numbered page memory cell array 10-11 and the odd-numbered page memory cell array 10-12 may be a memory block, a memory bank, or a memory rank.

Figure 4:
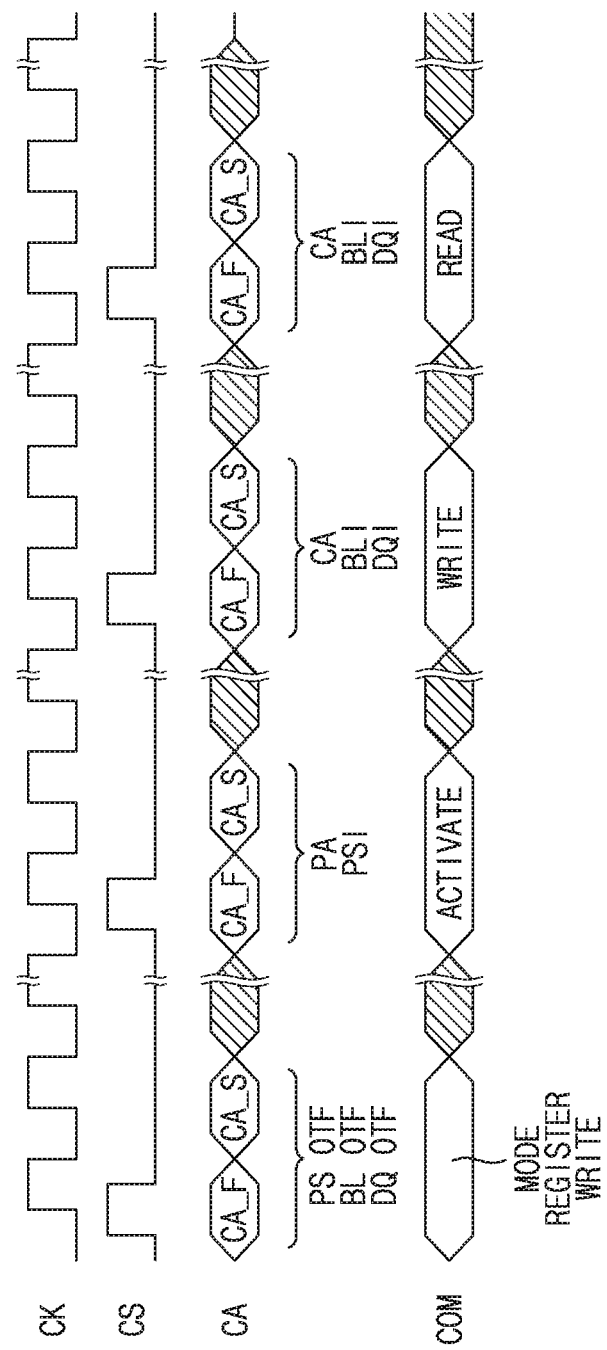
FIG. 4 is a timing diagram of signals according to a command truth table according to some example embodiments of the inventive concepts.

FIG. 3 is a command truth table regarding commands and addresses applied from the outside of the semiconductor memory device 100 according to some example embodiments of the inventive concepts. FIG. 4 is a timing diagram of signals applied to the semiconductor memory device 100 according to some example embodiments of the inventive concepts.

Referring to FIGS. 3 and 4, command and address signals CA1 to CA5 having a "low" level, a "high" level, a "high" level, a "low" level, and a "low" level command indicating a mode set command MODE REGISTER WRITE together with a chip selection signal CS having a "high" level may be input at a rising edge of a clock signal CK. Page size on-the-fly PS OTF, burst length on-the-fly BL OTF, and data on-the-fly DQ OTF may be set according to command and address signals CA3 to CA5 applied together with the chip selection signal CS having a "low" level at a rising edge of the clock signal CK. The other command and address signals of a shaded region I may include other mode set codes. Restated, an address included in a command and address may be input as a mode set code.

The command and address signals CA1 and CA2 having a "high" level, and a "low" level indicating an active command ACTIVATE together with the chip selection signal CS having the "high" level may be input at a rising edge of the clock signal CK. The page size information PSI may be a command and address signal CAn applied together with the chip selection signal CS having the "high" level at a rising edge of the clock signal CK, or a command and the address signal CA4 applied together with the chip selection signal CS having the "low" level at the rising edge of the clock signal CK. The command and address signals of a shaded region II may include a row address.

The page size information PSI may consist of two bits (2 bits), an upper bit ("one bit of the 2 bits," "a first bit of the 2 bits," etc.) may designate a full-page size or half-page size, and the other lower bit may instruct to select the even-numbered page memory cell array 10-11 or the odd-numbered page memory cell array 10-12. For example, when the page size on-the-fly PS OTF has a "high" level, the full-page size may be set when the upper bit of the page size information PSI has a "high" level, and the half-page size may be set when the upper bit has a "low" level. When the upper bit of the page size information PSI has a "high" level, information of the lower bit thereof may be ignored. When the upper bit of the page size information PSI has a "low" level, the half-page size may be set. The odd-numbered page memory cell array 10-12 may be designated when the lower bit of the page size information PSI has a "low" level, and the even-numbered page memory cell array 10-11 may be designated when the lower bit of the page size information PSI has a "high" level. The lower bit of the page size information PSI may be one of bits of the column address CADD of the semiconductor memory device 100 and may be the most significant bit of the column address CADD. Power consumption of the semiconductor memory device 100 when the half-page size is designated by the page size information PSI may be lower than that when the full-page size is designated.

The command and address signals CA1 to CA5 having a "low" level, a "low" level, a "high" level, a "low" level, and a "low" level indicating the write command WRITE, and the address signals CA1 to CA5 may be input at a rising edge of the clock signal CK, together with the chip selection signal CS having the "high" level. The command and address signals CA1 to CA5 having a "low" level, a "high" level, a "low" level, a "low" level, and a "low" level indicating the read command READ may be input at the rising edge of the clock signal CK, together with the chip selection signal CS having the "high" level. When the write command WRITE or the read command READ is input, the burst length information BLI and the data bit number information DQI may be set according to a command and the address signal CAn applied at the rising edge of the clock signal CK, together with the chip selection signal CS having the "high" level, and a command and the address signal CA4 applied at the rising edge of the clock signal CK, together with the chip selection signal CS having the "low" level, respectively. The command and address signals of a shaded region III may include a column address CADD.

The burst length information BLI may consist of 1 bit, and designate the number ("quantity") of bits of data to be sequentially input to or output from the outside (e.g., a third quantity of the first quantity of bits of data to be sequentially input in response to the first burst length signal bl1 and/or a fourth quantity of the second quantity of bits of data to be sequentially output in response to the second burst length signal bl2). The data bit number information DQI may consist of 1 bit, and designate the number of bits of input/output data to be simultaneously input or output. As the number of bits of input/output data to be simultaneously input or output according to the data bit number information DQI decreases, power consumption of the semiconductor memory device 100 may be decreased. Furthermore, as the number of bits of data to be sequentially input or output according to the burst length information BLI decreases, power consumption of the semiconductor memory device 100 may be decreased.

Figure 5:
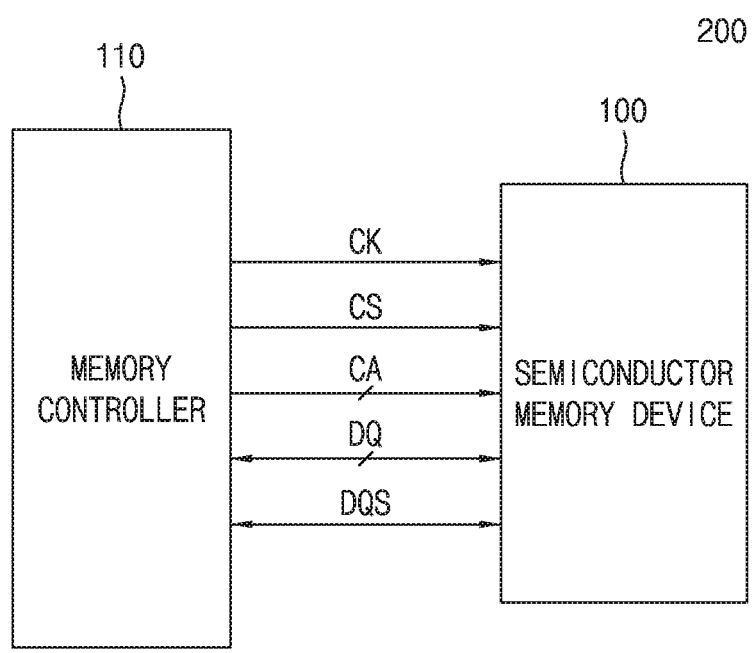
FIG. 5 is a block diagram illustrating a configuration of a memory system according to some example embodiments of the inventive concepts.

FIG. 5 is a block diagram illustrating a configuration of a memory system 200 according to some example embodiments of the inventive concepts.

Referring to FIG. 5, the memory system 200 may include a memory controller 110 and a semiconductor memory device 100. The memory controller 110 may transmit a clock signal CK, a chip selection signal CS, a command and address CA to the semiconductor memory device 100, and may input ("receive") data DQ and a data strobe signal DQS from, or output data DQ and a data strobe signal DQS to, the semiconductor memory device 100. The semiconductor memory device 100 may input the clock signal CK, the chip selection signal CS, the command and address CA, and may input the data DQ and the data strobe signal DQS to or output them from the memory controller 110.

Figure 6:
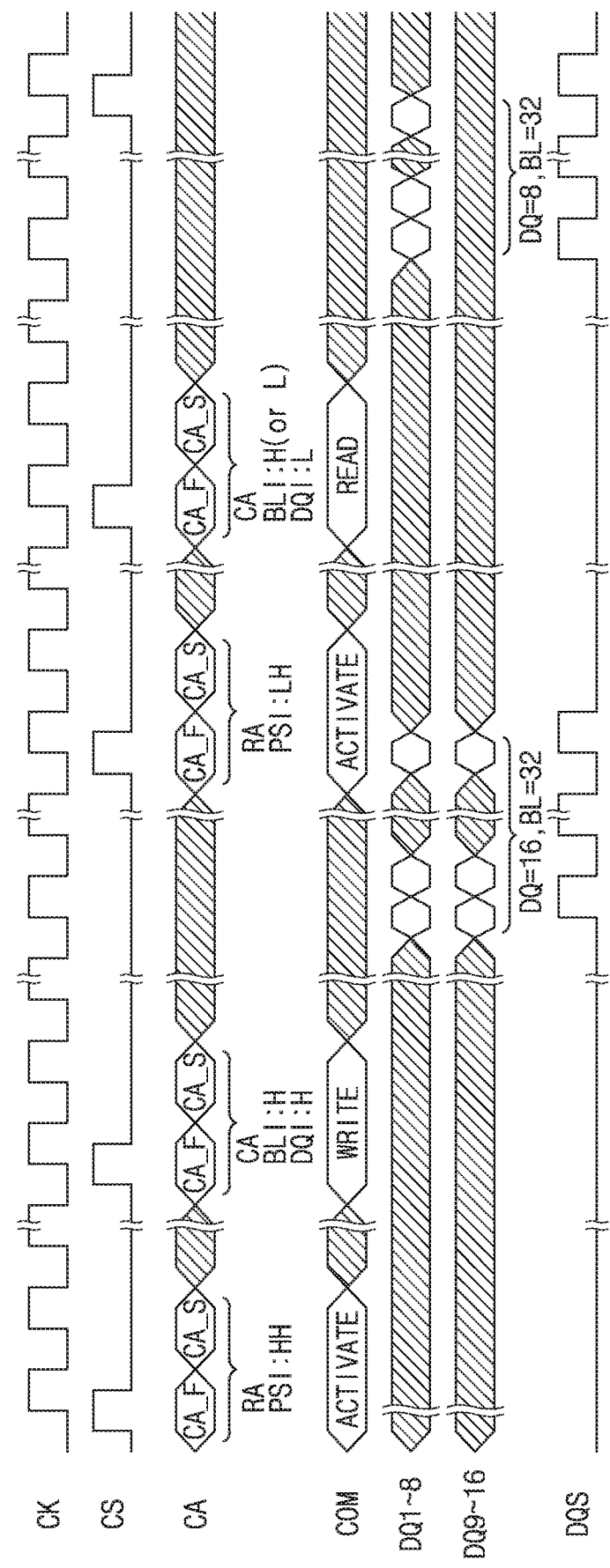
FIG. 6 is a timing diagram for describing an operation of a memory system according to some example embodiments of the inventive concepts.

FIG. 6 is a timing diagram illustrating an operation of the memory system 200 of FIG. 5. Here, it is assumed that the page size on-the-fly PS OTF, the burst length on-the-fly BL OTF, and the data on-the-fly DQ OTF of the mode set register 14 of the semiconductor memory device 100 of FIG. 1 are set to indicate an enabled state.

Referring to FIGS. 1 to 6, the memory controller 110 may apply an active command ACT together with a chip selection signal CS having a "high" level to the semiconductor memory device 100 at a rising edge of the clock signal CK. The memory controller 110 may apply a row address RADD and 2-bit page size information PSI having "high" levels ("magnitudes," "values," etc.), together with the active command ACTIVATE. Thus, the semiconductor memory device 100 may be set to a full-page size, and generate an even-numbered page selection signal pse and an odd-numbered page selection signal pso having the "high" levels.

The memory controller 110 may apply a write command WRITE together with the chip selection signal CS having a "high" level to the semiconductor memory device 100 at a rising edge of the clock signal CK. The memory controller 110 may apply a column address CADD, and burst length information BLI and data bit number information DQI having the "high" levels, together with the write command WRITE. Accordingly, a burst length BL of the semiconductor memory device 100 may be set to 32, and the number of bits of data DQ may be set to 16.

Thus, the semiconductor memory device 100 may sequentially input 16-bit data DQ1 to DQ16 having the burst length BL of 32 applied to be aligned with a center of the data strobe signal DQS applied from the outside to memory cells connected to one word line of the even-numbered page memory cell array 10-11 and one word line of the odd-numbered page memory cell array 10-12 of the memory cell array 20 selected by the row address RADD and the column address CADD.

Furthermore, the memory controller 110 may apply an active command ACTIVATE together with the chip selection signal CS having a "high" level to the semiconductor memory device 100 at a rising edge of the clock signal CK. The memory controller 110 may apply the row address RADD and 2-bit page size information PSI having a "low" level and a "high" level, together with the active command ACTIVATE. Thus, the semiconductor memory device 100 may be set to the half-page size, and generate the even-numbered page selection signal pse.

The memory controller 110 may apply a read command READ together with the chip selection signal CS having a "high" level to the semiconductor memory device 100 at a rising edge of the clock signal CK. The memory controller 110 may apply a column address CADD, burst length information BLI having a "high" level (or a "low" level), and data bit number information DQI having a "low" level ("magnitude"), together with the read command READ. Accordingly, a burst length BL of the semiconductor memory device 100 may be set to 32 (or 16), and the number of bits of data DQ may be set to 8.

At least partially restating the above, the data bit number information DQI applied for the write command WRITE may be set by the memory controller 110 to have a greater level than data bit number information DQI applied for the read command READ. In addition, the page size information applied for the write command WRITE may be set by the memory controller 110 to have a greater level than page size information PSI applied for the read command READ. In addition, the burst length information BLI applied together with the write command WRITE may be set by the memory controller 110 to have a greater level than burst length information BLI applied together with the read command READ.

Thus, the semiconductor memory device 100 may sequentially output 8-bit data DQ1 to DQ8 having the burst length BL of 32 (or 16) so that data output from memory cells connected to one word line of the even-numbered page memory cell array 10-11 of the memory cell array 20 selected by the row address RADD and the column address CADD is aligned with an edge of the data strobe signal DQS.

That is, the memory controller 110 may set a page size of the semiconductor memory device 100 to the full-page size, the burst length thereof to 32, and the number ("quantity") of bits of data to 16 in response to the write operation being performed, and may set the page size of the semiconductor memory device 100 to the half-page size, the burst length thereof to 32 (or 16), and the number of bits of data to 8 in response to the read operation being performed. Thus, power consumption of the semiconductor memory device 100 during the read operation may be lower than that during the write operation. Thus, operational efficiency (e.g., electrical power consumption), and thus performance, of the semiconductor memory device may be improved.

Figure 7:
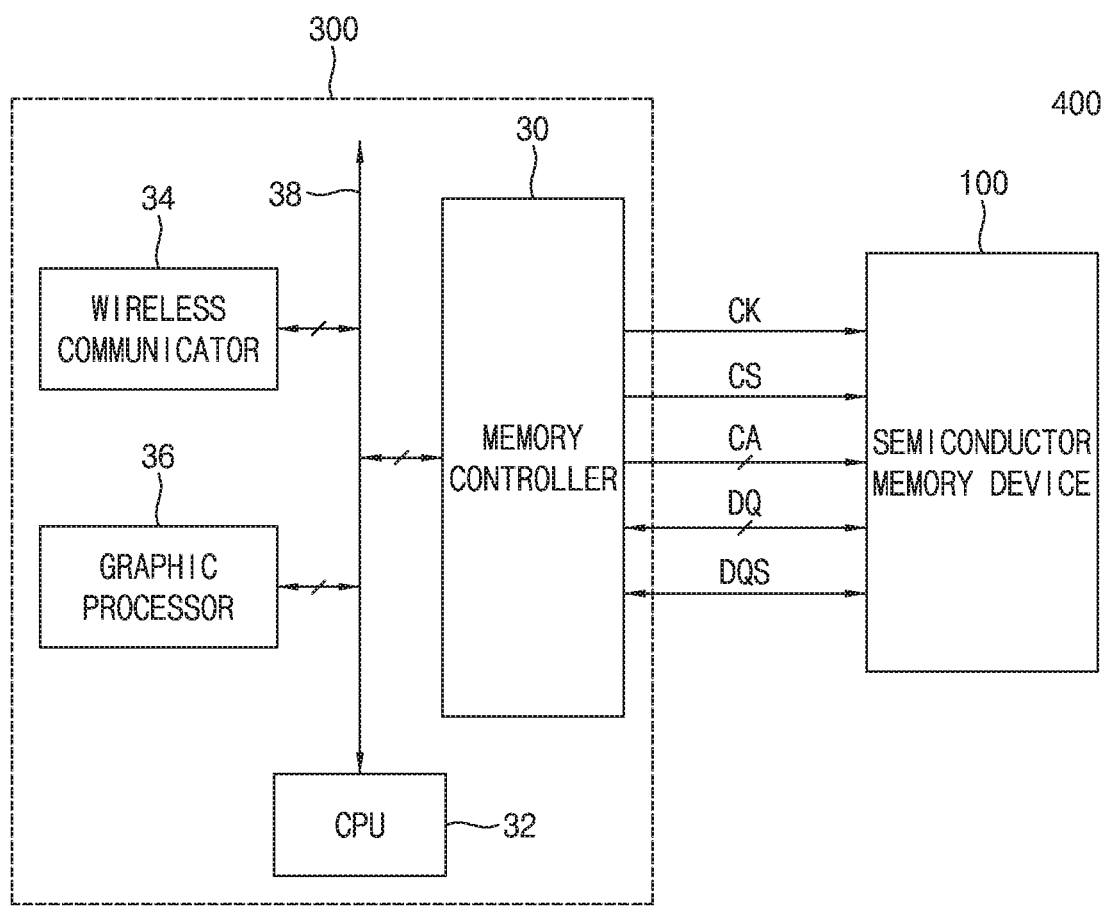
FIG. 7 is a block diagram illustrating a configuration of an electronic device according to some example embodiments of the inventive concepts.

FIG. 7 is a block diagram illustrating a configuration of an electronic device 400 according to some example embodiments of the inventive concepts. The electronic device 400 may include a semiconductor memory device 100 and a system on chip (SoC) 300. The SoC 300 may include a memory controller 30, a central processing unit (CPU) 32, a wireless communicator 34, and a graphic processor 36. The CPU 32, the memory controller 30, the wireless communicator 34, and the graphic processor 36 may transmit data, an address, a command, and a control signal via a bus 38.

Functions of the blocks illustrated in FIG. 7 will be described below.

The semiconductor memory device 100 may input a chip selection signal CS, a command and address CA, and input or output data DQ together with a data strobe signal DQS, in response to a clock signal CK. The memory controller 30 may input or output data between the semiconductor memory device 100 and either the wireless communicator 34 or the graphic processor 36, under control of the CPU 32. The memory controller 30 may transmit the clock signal CK, the chip selection signal CS, the command, and the address CA to the semiconductor memory device 100, and input or output the data DQ and the data strobe signal DQS. The wireless communicator 34 may transmit or receive data through wireless communication. The graphic processor 36 may process an image signal input via a camera (not shown). The CPU 32 may control the memory controller 30, the wireless communicator 34, and the graphic processor 36.

In FIG. 7, the wireless communicator 34 may read data using a low bandwidth, and the graphic processor 36 may read data using a high bandwidth (e.g., a bandwidth that is "greater" than the first bandwidth). Restated, the wireless communicator 34 may be a "first function device" device configured to input or output data using a first bandwidth and the graphic processor 36 may be a "second function device" configured to input or output data using a second bandwidth that is greater than the first bandwidth. The wireless communicator 34 represents a representative example of functional blocks using the low bandwidth. The graphic processor 36 represents a representative example of functional blocks using the high bandwidth. In addition, the electronic device 400 may further include other various functional blocks, as well as the functional blocks illustrated in FIG. 7. Here, the term "bandwidth" may be understood as the number of bits of data to be simultaneously output.

Figure 8:
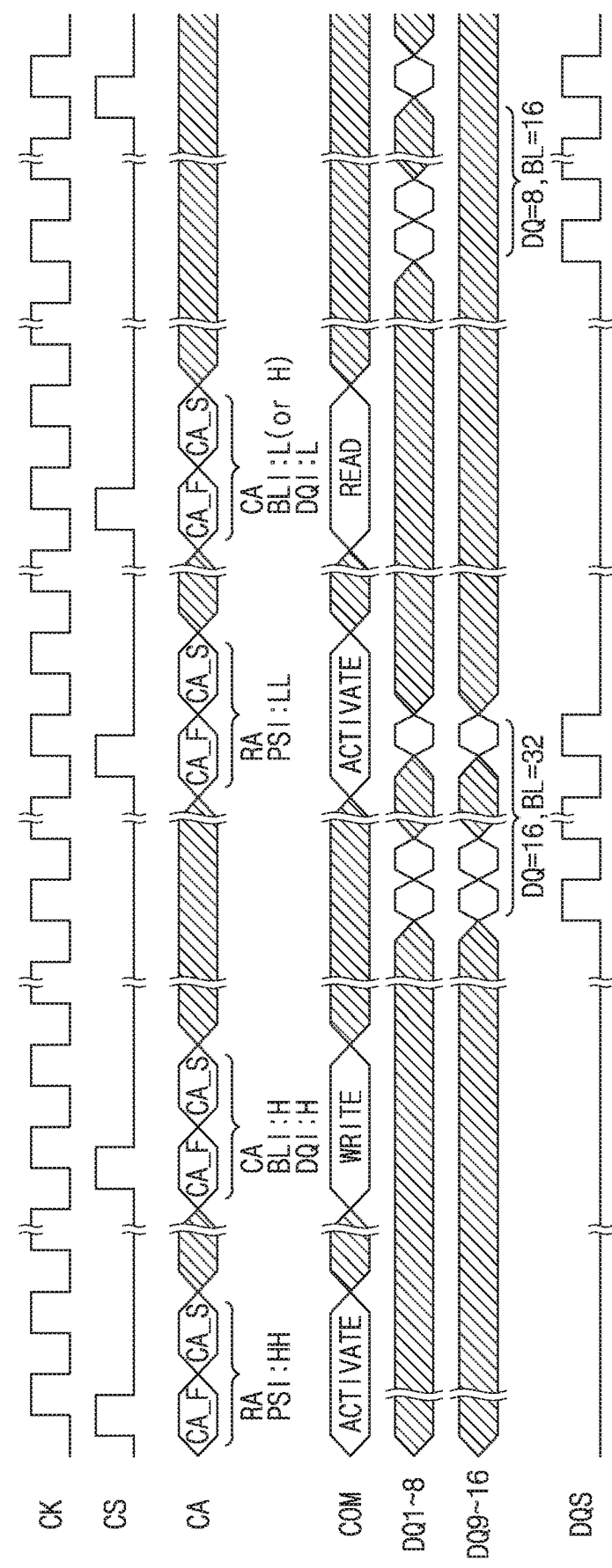
FIG. 8 is a timing diagram for describing an operation of an electronic device according to some example embodiments of the inventive concepts.

FIG. 8 is a timing diagram illustrating an operation of the electronic device 400 of FIG. 7. Here, it is assumed that the page size on-the-fly PS OTF, the burst length on-the-fly BL OTF, and the data on-the-fly DQ OTF of the mode set register 14 of the semiconductor memory device 100 of FIG. 1 are set to an enabled state.

Referring to FIGS. 1 to 4, 7, and 8, the memory controller 30 may apply the active command ACTIVATE together with the chip selection signal CS having the "high" level to the semiconductor memory device 100 at the rising edge of the clock signal CK, when transmitting data from the semiconductor memory device 100 to the graphic processor 36. The memory controller 30 may apply a row address RADD and 2-bit page size information PSI having "high" levels, together with the active command ACTIVATE. Thus, the semiconductor memory device 100 may be set to a full-page size, and generate an even-numbered page selection signal pse and an odd-numbered page selection signal pso having "high" levels. The semiconductor memory device 100 may generate a row address RADD and page size information PSI included in a received address and generate both an even-numbered page selection signal pse and an odd-numbered page selection signal pso based on the page size information PSI in response to a received command being an active command ACTIVATE.

The memory controller 30 may apply a read command READ together with the chip selection signal CS having a "high" level to the semiconductor memory device 100 at a rising edge of the clock signal CK. The memory controller 110 may apply ("generate") a column address CADD, burst length information BLI having a "high" level, and data bit number information DQI having a "high" level, together with the read command READ. Thus, a burst length BL of the semiconductor memory device 100 may be set to 32, and the number of bits of data DQ may be set to 16.

Thus, the semiconductor memory device 100 may sequentially output 16-bit data DQ1 to DQ16 having the burst length BL of 32 so that data output from memory cells selected by the column address CADD among memory cells connected to one word line of the even-numbered page memory cell array 10-11 and one word line of the odd-numbered page memory cell array 10-12 of the memory cell array 20 which are selected by the row address RADD is aligned with an edge of a data strobe signal DQS. The semiconductor memory device 100 may generate a column address CADD included in a received command and address CA in response to a received command being the write command WRITE or the read command READ.

When transmitting data from the semiconductor memory device 100 to the wireless communicator 34, the memory controller 30 may apply an active command ACTIVATE together with the chip selection signal CS having a "high" level to the semiconductor memory device 100 at a rising edge of the clock signal CK. The memory controller 30 may apply the row address RADD, and 2-bit page size information PSI having "low" levels, together with the active command ACTIVATE. Thus, the semiconductor memory device 100 may be set to a half-page size, and generate the odd-numbered page selection signal pso.

The memory controller 30 may apply a read command READ together with the chip selection signal CS having a "high" level to the semiconductor memory device 100 at a rising edge of the clock signal CK. The memory controller 110 may apply a column address CADD, burst length information BLI having a "low" level (or a "high" level), and data bit number information DQI having a "low" level, together with the read command READ. Accordingly, a burst length BL of the semiconductor memory device 100 may be set to 16 (or 32), and the number of bits of data DQ may be set to 8.

Restated, for example, the memory controller 30 may set the data bit number information applied with transmitting data from the semiconductor memory device 100 to the first function device ("wireless communicator 34") to be a level that is less than a level of data bit number information applied when transmitting data from the semiconductor memory device 100 to the second function device ("graphic processor 36").

Accordingly, the semiconductor memory device 100 may sequentially output 8-bit data DQ1 to DQ16 having the burst length BL of 16 (or 32) so that data output from memory cells selected by the column address CADD among memory cells connected to one word line of the odd-numbered page memory cell array 10-12 of the memory cell array 20 selected by the row address RADD is aligned with an edge of the data strobe signal DQS. That is, the memory controller 110 may decrease power consumption of the electronic device 400 by setting the page size, the number of bits of data, and/or the burst length when transmitting data from the semiconductor memory device 100 to the wireless communicator 34 to be less than those when transmitting the data from the semiconductor memory device 100 to the graphic processor 36.

Figure 9:
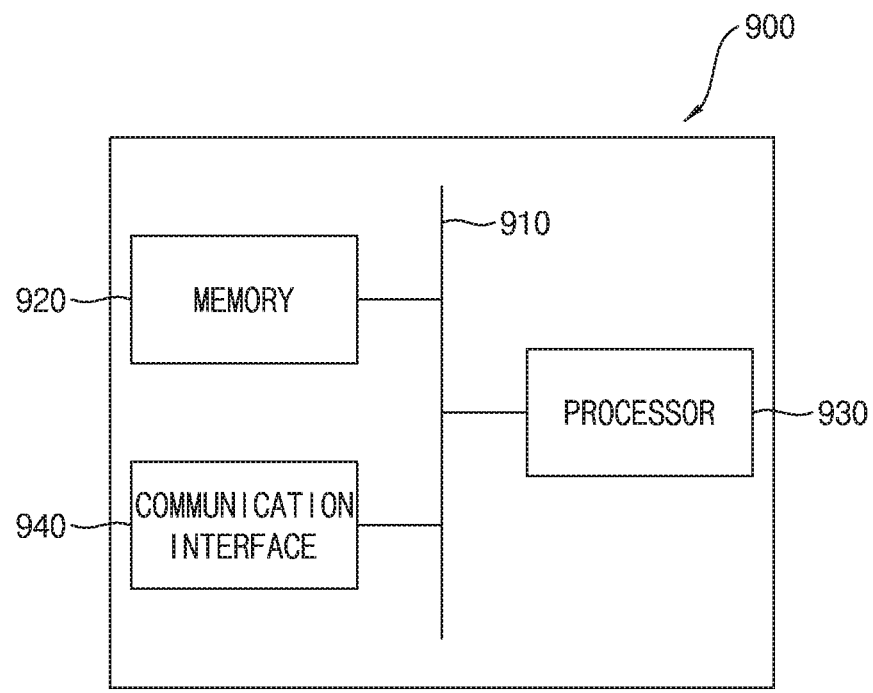
FIG. 9 is a diagram illustrating an electronic device according to some example embodiments.

FIG. 9 is a diagram illustrating an electronic device 900 according to some example embodiments. The electronic device 900 as described herein may include, and/or may be configured to implement the functionality of, one or more portions of the semiconductor memory device 100, system on chip (SoC) 300, and the like as described herein. The electronic device 900 as described herein may include, and/or may be configured to implement the functionality of, an entirety of the semiconductor memory device 100 as described herein. The electronic device 900 as described herein may include, and/or may be configured to implement the functionality of, some or all of a memory system as described herein. The electronic device 900 as described herein may include, and/or may be configured to implement the functionality of, one or more portions of the electronic device 400 as described herein.

Referring to FIG. 9, the electronic device 900 includes a memory 920, a processor 930, and a communication interface 940.

The electronic device 900 may be included in one or more various electronic devices, including, for example, a mobile phone, a computer device, a digital camera, a sensor device, and the like. A mobile device may include a mobile phone, a smartphone, a personal digital assistant (PDA), some combination thereof, or the like. A computing device may include a personal computer (PC), a tablet computer, a laptop computer, a netbook, some combination thereof, or the like.

The memory 920, the processor 930, and the communication interface 940 may communicate with one another through a bus 910.

The communication interface 940 may communicate data from an external device (e.g., external source) using wired transmission and/or various Internet protocols. The external device may include, for example, an image providing server, a display device, a mobile device such as, a mobile phone, a smartphone, a personal digital assistant (PDA), a tablet computer, and a laptop computer, a computing device such as a personal computer (PC), a tablet PC, and a netbook, an image outputting device such as a TV and a smart TV, and an image capturing device such as a camera and a camcorder.

The processor 930 may execute a program and control the electronic device 900. A program code ("program of instructions") to be executed by the processor 930 may be stored in the memory 920. An electronic system may be connected to an external device through an input/output device (not shown) and exchange data with the external device.

The memory 920 may store information. The memory 920 may be a volatile or a nonvolatile memory. The memory 920 may be a non-transitory computer readable storage medium. The memory may store computer-readable instructions that, when executed, cause the execution of one or more methods, functions, processes, etc. as described herein. In some example embodiments, the processor 930 may execute one or more of the computer-readable instructions stored at the memory 920.

In some example embodiments, the electronic device may include a display panel (not illustrated).

In some example embodiments, the communication interface 940 may include a USB and/or HDMI interface. In some example embodiments, the communication interface 940 may include a wireless communication interface. In some example embodiments, the communication interface 940 may include a wired communication interface.

According to some example embodiments of the inventive concepts, the operation of the semiconductor memory device may be performed while changing the number of bits of data, the page size, and/or the burst length, in response to the data information, the page size information, and/or the burst length information input from the outside.

According to some example embodiments of the inventive concepts, a smaller number of bits of data may be input or output during the read operation or the write operation of the semiconductor memory device, thereby decreasing power consumption. Furthermore, the read operation or the write operation may be performed by reducing the page size, thereby decreasing power consumption. In addition, the read operation or the write operation may be performed by reducing the burst length, thereby decreasing power consumption and thus improving operation of the semiconductor memory device and thus any electronic device including same.

According to some example embodiments of the inventive concepts, power consumption of batteries of the memory module and the electronic device may be decreased.

While some example embodiments of the inventive concepts have been described with reference to the accompanying drawings, it should be understood by those skilled in the art that various modifications may be made without departing from the scope of the inventive concepts and without changing essential features thereof. Therefore, the above-described example embodiments should be considered in a descriptive sense only and not for purposes of limitation.

What is claimed is:

1. A semiconductor memory device, comprising:
a mode set register configured to input a mode set code applied together with a mode set command to set a data on-the-fly associated with a number of bits of data in response to the mode set command;
a control signal generator configured to input data bit number information indicating a first quantity of bits of data applied together with a write command to generate a first data signal and input the data bit number information indicating a second quantity of bits of data applied together with a read command to generate a second data signal, in response to the data on-the-fly being set to an enabled state;
a memory cell array configured to input write data to or output read data from memory cells selected by a word line selection signal generated based on a row address and an active command and a column selection signal generated based on a column address and the write command or the read command;
a data writer configured to input the first quantity of bits of data received from an external source to transmit the write data to the selected memory cells, in response to the write command and the first data signal;
a data reader configured to input the read data received from the selected memory cells to transmit the second quantity of bits of data to the external source, in response to the read command and the second data signal; and
a command and address generator configured to generate the row address and page size information included in an address applied together with the active command, generate the column address and the data bit number information included in the address applied together with the write command, and generate the column address and the data bit number information included in the address applied together with the read command,
wherein the first quantity of bits of data is different from the second quantity of bits of data, and
wherein the page size information is in the same clock cycle as the active command, and the data bit number information is in the same clock cycle as the write command or the read command.

2. The semiconductor memory device of claim 1, wherein the command and address generator is further configured to
generate the mode set command, the active command, the write command, or the read command based on decoding a command included in a command and address received from the external source, and
generate the mode set code based on an address included in the command and address applied together with the mode set command.

3. The semiconductor memory device of claim 2, wherein the mode set register is configured to input the mode set code to set a page size on-the-fly associated with a page size of the semiconductor memory device in response to the mode set command, and
the control signal generator is further configured to input the page size information to generate both an even-numbered page selection signal and an odd-numbered page selection signal in response to the page size on-the-fly being set to an enabled state.

4. The semiconductor memory device of claim 3, wherein the command and address generator is further configured to
generate burst length information included in the address applied together with the write command or the read command,
the mode set register is further configured to input the mode set code to set a burst length on-the-fly associated with a burst length in response to the mode set command,
the control signal generator is further configured to input the burst length information to generate a first burst length signal in response to the write command and in response to the burst length on-the-fly being set to an enabled state, and input the burst length information to generate a second burst length signal in response to the read command and in response to the burst length on-the-fly being set to the enabled state,
the data writer is configured to sequentially input the first quantity of bits of data by a third quantity in response to the first burst length signal, and
the data reader is configured to sequentially output the second quantity of bits of data by a fourth quantity in response to the second burst length signal.

5. The semiconductor memory device of claim 3, wherein the memory cell array includes
an even-numbered page driver configured to be enabled in response to the even-numbered page selection signal and to drive a plurality of even-numbered word lines in response to the word line selection signal;
an even-numbered page memory cell array including a plurality of even-numbered memory cells connected between the plurality of even-numbered word lines and a plurality of even-numbered bit lines;
an odd-numbered page driver configured to be enabled in response to the odd-numbered page selection signal and to drive a plurality of odd-numbered word lines in response to the word line selection signal; and
an odd-numbered page memory cell array including a plurality of odd-numbered memory cells connected between the plurality of odd-numbered word lines and a plurality of odd-numbered bit lines.

6. The semiconductor memory device of claim 5, wherein the page size information includes 2 bits, one bit of the 2 bits designating a full-page size or a half-page size,
both the even-numbered page selection signal and the odd-numbered page selection signal are activated in response to a first bit of the 2 bits designating the full-page size, and
one signal of the even-numbered page selection signal or the odd-numbered page selection signal is activated based on a second bit of the page size information in response to the first bit of the 2 bits designating the half-page size.

7. The semiconductor memory device of claim 2, wherein the command and address generator is further configured to
generate burst length information included in the address applied together with the write command or the read command,
the mode set register is further configured to input the mode set code to set a burst length on-the-fly associated with a burst length in response to the mode set command,
the control signal generator is further configured to input the burst length information to generate a first burst length signal in response to the write command and in response to the burst length on-the-fly being set to an enabled state, and input the burst length information to generate a second burst length signal in response to the read command and in response to the burst length on-the-fly being set to the enabled state,
the data writer is configured to sequentially input the first quantity of bits of data by a third quantity in response to the first burst length signal, and
the data reader is configured to sequentially output the second quantity of bits of data by a fourth quantity in response to the second burst length signal.

8. An electronic device comprising:
a system on chip configured to apply a chip selection signal and a command and address, and input or output data, in response to a clock signal; and
a semiconductor memory device configured to process the chip selection signal and the command and address applied, and input or output the data, in response to the clock signal,
wherein the system on chip includes
a first function device configured to input or output the data using a first bandwidth;
a second function device configured to input or output the data using a second bandwidth which is greater than the first bandwidth;
a memory controller configured to control data to be input or output between the first function device and the semiconductor memory device, and control data to be input or output between the second function device and the semiconductor memory device; and
a central processing unit configured to control the first function device, the second function device, and the memory controller, and
the semiconductor memory device is further configured to
input an address included in the command and address as a mode set code to generate a data on-the-fly associated with a number of bits of data when the chip selection signal and a command included in the command and address applied in response to the clock signal indicate a mode set command,
input a first quantity of bits of data from an external source in response to data bit number information included in the address in response to the data on-the-fly being set to an enabled state and further in response to the command being a write command, and
output a second quantity of bits of data to the external source in response to the data bit number information included in the address in response to the data on-the-fly being set to the enabled state and further in response to the command being a read command,
wherein the first quantity of bits of data is different from the second quantity of bits of data, and
wherein the data bit number information is in the same clock cycle as the write command or the read command.

9. The electronic device of claim 8, wherein the memory controller is further configured to set the data bit number information applied when transmitting data from the semiconductor memory device to the first function device to be a level that is less than a level of data bit number information applied when transmitting data from the semiconductor memory device to the second function device.

10. The electronic device of claim 9, wherein
the semiconductor memory device is further configured to
input the mode set code included in the address to set a page size on-the-fly in response to the mode set command,
input a row address and page size information included in the address to generate an even-numbered page selection signal and an odd-numbered page selection signal using the page size information in response to the page size on-the-fly being set to an enabled state and further in response to the command being an active command, and
generate a column address included in the address in response to the command being the write command or the read command, and
the memory controller is further configured to set page size information applied for the write command to be a level that is greater than a level of page size information applied for the read command,
wherein the page size information is in the same clock cycle as the active command.

11. The electronic device of claim 10, wherein
the semiconductor memory device is further configured to
input the mode set code included in the address to set a burst length on-the-fly in response to the command being the mode set command,
generate a first burst length signal based on burst length information included in the address in response to the burst length on-the-fly being set to an enabled state and further in response to the command being the write command,
generate a second burst length signal based on the burst length information included in the address in response to the burst length on-the-fly being set to an enabled state and further in response to the command being the read command,
sequentially input the first quantity of bits of data by a third quantity in response to the first burst length signal, and
sequentially output the second quantity of bits of data by a fourth quantity in response to the second burst length signal, and
the memory controller is further configured to set the burst length information applied when transmitting data from the semiconductor memory device to the first function device to be a level that is equal to or less than a level of the burst length information applied when transmitting data from the semiconductor memory device to the second function device.

12. A memory system comprising:
a memory controller configured to apply a chip selection signal and a command and address, and input or output data, in response to a clock signal; and
a semiconductor memory device configured to input the chip selection signal and the command and address, and input or output the data, in response to the clock signal,
wherein the semiconductor memory device is further configured to
input an address included in the command and address as a mode set code to set a data on-the-fly associated with a number of bits of data when the chip selection signal and a command included in the command and address applied in response to the clock signal indicate a mode set command,
input a first quantity of bits of data input from an external source in response to data bit number information indicating a first quantity of bits of data included in the address in response to the data on-the-fly being set to an enabled state and further in response to the command being a write command, and
output a second quantity of bits of data to the external source in response to the data bit number information indicating a second quantity of bits of data included in the address in response to the data on-the-fly being set to the enabled state and further in response to the command being a read command,
wherein the first quantity of bits of data is different from the second quantity of bits of data, and
wherein the data bit number information is in the same clock cycle as the write command or the read command.

13. The memory system of claim 12, wherein the memory controller is further configured to set data bit number information applied for the write command to have a greater level than data bit number information applied for the read command.

14. The memory system of claim 12, wherein the semiconductor memory device is further configured to
receive the mode set code included in the address to set a page size on-the-fly associated with a page size of the semiconductor memory device in response to the command being the mode set command,
generate a row address and page size information included in the address and generate both an even-numbered page selection signal and an odd-numbered page selection signal based on the page size information in response to the page size on-the-fly being set to an enabled state and further in response to the command being an active command, and
generate a column address included in the address in response to the command being the write command or the read command, and
wherein the page size information is in the same clock cycle as the active command.

15. The memory system of claim 14, wherein the memory controller is further configured to set page size information applied for the write command to have a greater level than page size information applied for the read command.

16. The memory system of claim 14, wherein
the semiconductor memory device includes a memory cell array,
the memory cell array includes
an even-numbered page driver configured to be enabled in response to the even-numbered page selection signal and to drive a plurality of even-numbered word lines in response to a word line selection signal generated using the row address;
an even-numbered page memory cell array including a plurality of even-numbered memory cells connected between the plurality of even-numbered word lines and a plurality of even-numbered bit lines;
an odd-numbered page driver configured to be enabled in response to the odd-numbered page selection signal and to drive a plurality of odd-numbered word lines in response to the word line selection signal; and
an odd-numbered page memory cell array including a plurality of odd-numbered memory cells connected between the plurality of odd-numbered word lines and a plurality of odd-numbered bit lines.

17. The memory system of claim 14, wherein the semiconductor memory device is further configured to
input the mode set code included in the address to set a burst length on-the-fly associated with a burst length in response to the command being the mode set command,
generate a first burst length signal based on burst length information included in the address in response to the burst length on-the-fly being set to an enabled state and further in response to the command being the write command,
generate a second burst length signal based on the burst length information included in the address in response to the burst length on-the-fly being set to the enabled state and further in response to the command being the read command,
sequentially input the first quantity of bits of data by a third quantity in response to the first burst length signal, and
sequentially output the second quantity of bits of data by a fourth quantity in response to the second burst length signal.

18. The memory system of claim 17, wherein the memory controller is further configured to set the burst length information applied together with the write command to have a level greater than or equal to a level of the burst length information applied together with the read command.

19. The memory system of claim 12, wherein the semiconductor memory device is further configured to
input the mode set code included in the address to set a burst length on-the-fly associated with a burst length in response to the command being the mode set command,
input a column address and burst length information included in the address to generate a first burst length signal in response to the burst length on-the-fly being set to an enabled state and further in response to the command being the write command,
input the column address and the burst length information included in the address to generate a second burst length signal in response to the burst length on-the-fly being set to the enabled state and further in response to the command being the read command,
sequentially input the first quantity of bits of data by a third quantity in response to the first burst length signal, and sequentially output the second quantity of bits of data by a fourth quantity in response to the second burst length signal.

20. The memory system of claim 19, wherein the memory controller is further configured to set burst length information applied together with the write command to have a level greater than or equal to a level of burst length information applied together with the read command.

* * * * *